(12) United States Patent
Smit et al.

(10) Patent No.: US 6,516,182 B1
(45) Date of Patent: Feb. 4, 2003

(54) HIGH GAIN INPUT STAGE FOR A RADIO FREQUENCY IDENTIFICATION (RFID) TRANSPONDER AND METHOD THEREFOR

(75) Inventors: Willem Smit, Chandler; Pieter Schieke, Phoenix, both of AZ (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 09/217,691

(22) Filed: Dec. 21, 1998

(51) Int. Cl.[7] ................................................ H04B 1/40
(52) U.S. Cl. ........................ 455/41; 455/341; 455/343; 455/292; 455/234.1
(58) Field of Search .......................... 455/41, 334, 341, 455/343, 269, 280, 291, 292, 234.1, 240.1; 327/530; 375/363

(56) References Cited

U.S. PATENT DOCUMENTS 5,600,683 A * 2/1997 Bierach et al. ............. 375/363
5,889,426 A * 3/1999 Kawakami et al. ......... 327/530

FOREIGN PATENT DOCUMENTS

DE      197 38 177 A 1        9/1998      ........... H03G/3/20

* cited by examiner

*Primary Examiner*—William Trost
*Assistant Examiner*—Philip J. Sobutka
(74) *Attorney, Agent, or Firm*—Baker Botts L.L.P.

(57) ABSTRACT

A high gain input stage for a Radio Frequency Identification (RFID) transponder uses an amplifier for increasing a magnitude of an input signal. A DC bias circuit is used for controlling the operation of the amplifier. A resonant circuit is coupled between the amplifier and the DC bias circuit. The resonant circuit is used for receiving a signal generated by an electromagnetic field and for generating the input signal which is sent to the amplifier. The resonant circuit has an inductive portion which is used to bias the amplifier thereby removing the requirement of using a decoupling capacitor.

16 Claims, 1 Drawing Sheet

HIGH GAIN INPUT STAGE FOR A RADIO FREQUENCY IDENTIFICATION (RFID) TRANSPONDER AND METHOD THEREFOR

BACKGROUND OF THE INVENTION

1. Field of the Invention

This invention relates generally to a Radio Frequency Identification (RFID) transponder and, more specifically, to a high gain low current input stage for an RFID transponder.

2. Description of the Prior Art

It is desirable to have a sensitive input into a transponder. In order to do this, one must amplify the input signal. Presently, most input stages require the use of a decoupling capacitor. The decoupling capacitor is required to isolate the DC bias component generated by the amplifying circuit from the external L-C circuit. It is desirable to isolate the DC bias component since one does not want the DC component to be short-circuited to ground via the inductor element of the external L-C circuit. Furthermore, the problem with using a decoupling capacitor is that the decoupling capacitor that is required is very large and consumes valuable silicon real estate.

Therefore, a need existed to provide an improved high gain input stage for a transponder. The improved high gain input stage must require fewer components to implement than prior art input stages. The improved high gain input stage must not require a decoupling capacitor. The improved high gain input stage must allow an automatic gain control circuit to be easily integrated therein. The improved high gain input stage must further have a low current consumption.

SUMMARY OF THE INVENTION

In accordance with one embodiment of the present invention, it is an object of this invention to provide an improved high gain input stage for a transponder.

It is another object of the present invention to provide an improved high gain input stage for a transponder which requires fewer components than prior art input stages.

It is still another object of the present invention to provide an improved high gain input stage biasing circuit for a transponder that does not require a decoupling capacitor.

It is yet another object of the present invention to provide an improved high gain input stage for a transponder wherein an automatic gain control circuit may be easily integrated therein.

It is still a further object of the present invention to provide an improved high gain input stage for a transponder that has a low current consumption.

BRIEF DESCRIPTION OF THE PREFERRED EMBODIMENTS

In accordance with one embodiment of the present invention, a high gain input stage for a Radio Frequency Identification (RFID) transponder is disclosed. The high gain input stage uses an amplifier for increasing a magnitude of an input signal. A DC bias circuit is used for controlling the operation of the amplifier. A resonant circuit is coupled between the amplifier and the DC bias circuit. The resonant circuit is used for receiving a signal generated by an electromagnetic field and for generating the input signal which is sent to the amplifier. The resonant circuit has an inductive portion which is used to DC bias the amplifier.

In accordance with another embodiment of the present invention, a method of providing a high gain input stage for a Radio Frequency Identification (RFID) transponder is disclosed. The method comprises the steps of: providing an amplifier for increasing a magnitude of an input signal; providing a DC bias circuit for controlling operation of the amplifier; and providing a resonant circuit coupled between the amplifier and the DC bias circuit for receiving a signal generated by an electromagnetic field and for generating the input signal sent to the amplifier wherein an inductive portion of the resonant circuit is used to DC bias the amplifier.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
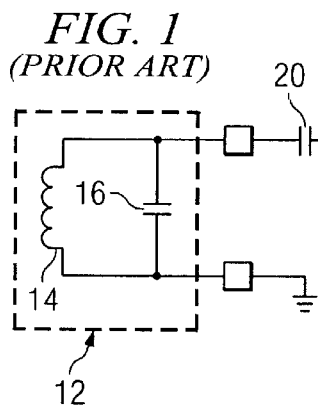
FIG. 1 is a simplified electrical schematic of a prior art high gain input stage.

Referring to FIG. 1, a prior art high gain input stage for a transponder 10 (hereinafter input stage 10) is shown. The input stage 10 has an external inductor-capacitor (L-C) circuit 12. The external L-C circuit 12 is comprised of an inductive element 14 coupled in parallel with a capacitive element 16. The external L-C circuit 12 will pick up a signal generated by an electromagnetic field. The L-C circuit 12 will generate a voltage after receiving the signal that was generated by the electromagnetic field. The voltage signal generated by the L-C circuit 12 is then fed into a first input of an amplifier 18. A second input of the amplifier 18 is coupled to a reference voltage $V_{REF}$ source. A feedback resistor 22 is coupled to an output and to the first input of the amplifier 18. A second resistor 24 is also coupled to the first input of the amplifier 18. The feedback resistor 22 and the second resistor 24 are used to set the voltage gain of the amplifier 18.

A decoupling capacitor 20 is also coupled to the first input of the amplifier 18. The decoupling capacitor 20 is required because the amplifier 18 needs to be biased at a certain voltage level to achieve optimal gain. Furthermore, the decoupling capacitor 20 is required to isolate the DC bias component generated by the amplifier 18 from the external L-C circuit 12 since one does not want the DC component to be short-circuited to ground via the inductive element 14 of the external L-C circuit 12. As stated above, the problem with using the decoupling capacitor 20 is that the decoupling capacitor 20 that is required is very large as is the amplifier 18. These two components consume valuable silicon real estate.

Figure 2:
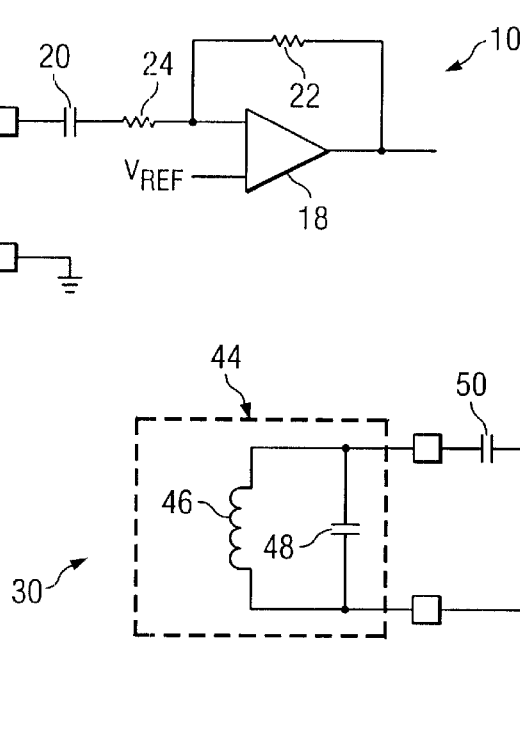
FIG. 2 is a simplified electrical schematic of another prior art high gain input stage.

Referring to FIG. 2, another prior art high gain input stage for a transponder 30 (hereinafter input stage 30) is shown. The input stage 30 uses a very simple amplifier 32. The amplifier 32 is a single transistor amplifier. The amplifier 32 is comprised of a current source 34. The current source 34 has a first terminal coupled to a voltage source $V_{DD}$. A second terminal of the current source 34 is coupled to a transistor 36. The transistor 36 has three terminals. The first terminal of transistor 36 is coupled to the current source 34. The second terminal of the transistor 36 is coupled to a bias circuit 38. The third terminal of the transistor 36 is coupled to ground.

As stated above, the second terminal of the transistor 36 is coupled to a bias circuit 38. The bias circuit 38 is used to control the operation of the amplifier 32 by biasing the amplifier 32 to the amplifier's threshold voltage. The bias circuit 38 is comprised of a current source 40. The current source 40 has a first terminal coupled to a voltage source $V_{DD}$. A second terminal of the current source 40 is coupled to a transistor 42. The transistor 42 has three terminals. The first terminal of transistor 42 is coupled to the current source 40. The second terminal of the transistor 42 is coupled to the first terminal of the transistor 42. The third terminal of the transistor 42 is coupled to ground.

Like the prior art input stage 10 shown in FIG. 1, the input stage 30 has an external inductor-capacitor (L-C) circuit 44. The external L-C circuit 44 is comprised of an inductive element 46 coupled in parallel with a capacitive element 48. The external L-C circuit 44 will pick up a signal generated by an electromagnetic field. The L-C circuit 44 will generate a voltage after receiving the signal that was generated by the electromagnetic field. The voltage signal generated by the L-C circuit 44 is then fed into the bias circuit 38 and the amplifier 32.

A decoupling capacitor 50 is coupled to the bias circuit 38 and the amplifier 32. The decoupling capacitor 50 is required to isolate the DC bias component generated by the bias circuit 38 from the L-C circuit 44 since one does not want the DC component to be short-circuited to ground via the inductive element 46 of the LC circuit 44. As stated above, the problem with using the decoupling capacitor 50 is that the decoupling capacitor 50 that is required is very large and consumes valuable silicon real estate.

Figure 3:
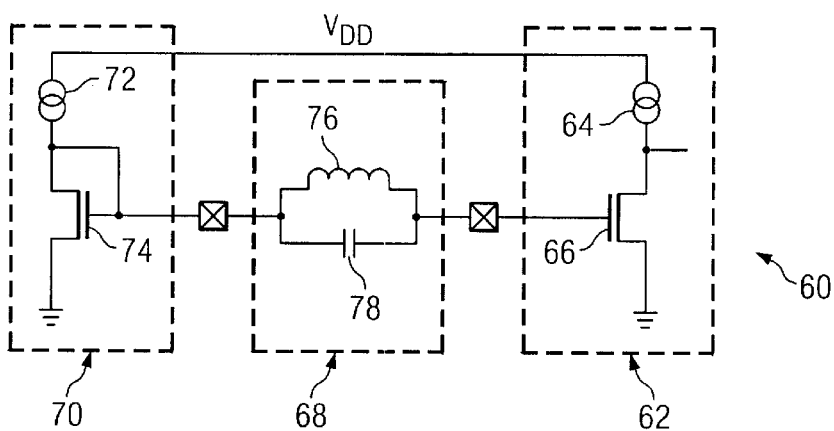
FIG. 3 is a simplified electrical schematic of one embodiment of the present invention.

Referring to FIG. 3, a high gain input stage for a transponder 60 (hereinafter input stage 60) is shown. The input stage 60 is unique in that the decoupling capacitor of the prior art is no longer required. This is accomplished by including the external L-C circuit 68 as part of the amplifier/DC bias circuit. Furthermore, the input stage 60 requires fewer components to implement, thereby saving valuable silicon real estate. The input stage 60 also may be biased via the inductive element 76 of the L-C circuit 68 which, as stated above, form part of the input stage 60.

The input stage 60 uses a very simple amplifier 62. The amplifier 62 is a single transistor amplifier. The amplifier 62 is comprised of a current source 64. The current source 64 has a first terminal coupled to a voltage source $V_{DD}$. A second terminal of the current source 64 is coupled to a transistor 66. The transistor 66 has three terminals. The first terminal of transistor 66 is coupled to the current source 64. The second terminal of the transistor 66 is coupled to the L-C circuit 68. The third terminal of the transistor 66 is coupled to ground.

A DC bias circuit 70 is coupled to the L-C circuit 68. The DC bias circuit 70 is used to control the operation of the amplifier 62 by DC biasing the amplifier 62 to the amplifier's threshold voltage via the L-C circuit 68. The DC bias circuit 70 is comprised of a current source 72. The current source 72 has a first terminal coupled to a voltage source $V_{DD}$. A second terminal of the current source 72 is coupled to a transistor 74. The transistor 74 has three terminals. The first terminal of transistor 74 is coupled to the current source 72. The second terminal of the transistor 74 is coupled to the first terminal of the transistor 74. The third terminal of the transistor 74 is coupled to ground.

The L-C circuit 68 is coupled in between the amplifier 62 and the DC bias circuit 70. The L-C circuit 68 is comprised of an inductive element 76 coupled in parallel with a capacitive element 78. The L-C circuit 68 now forms part of the amplifier-DC bias circuit (i.e., input stage 60). The biasing of the amplifier 62 now flows through the inductive element 76 so that the amplifier 62 is biased at a DC operating voltage level. Therefor, the prior art decoupling capacitor is no longer required.

Figure 4:
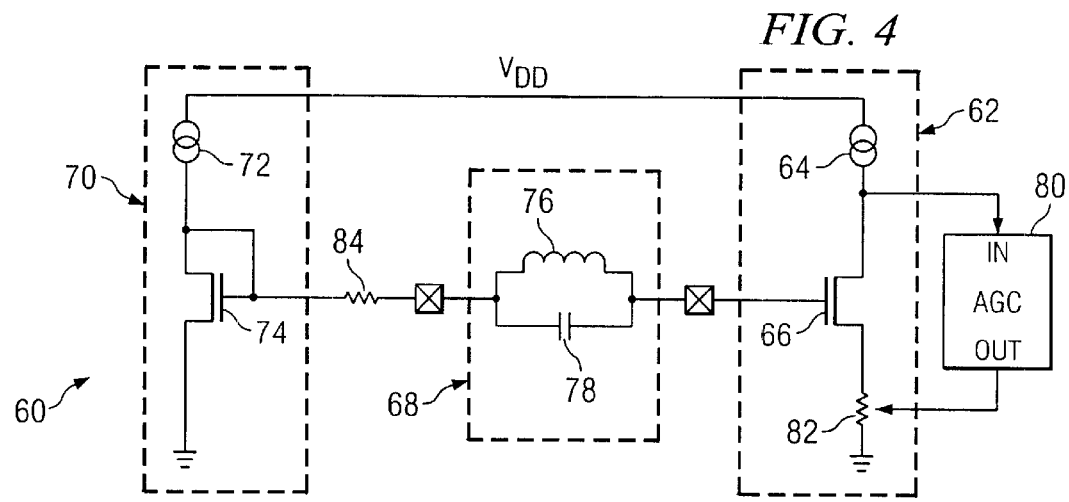
FIG. 4 is a simplified electrical schematic of a second embodiment of the present invention.

Referring now to FIG. 4 wherein like numerals represent like elements, another embodiment of the input stage 60 of the present invention is shown. The embodiment depicted in FIG. 4 is similar to that shown in FIG. 3. One difference between the embodiments is that the input stage 60 shown in FIG. 4 has an automatic gain control circuit 80 coupled to the amplifier 62. The automatic gain control circuit 80 is used to adjust the gain of the amplifier 62. The automatic gain control circuit 80 accomplishes this by adjusting the resistance level of the resistor 82 which is coupled to the transistor 66 of the amplifier 62. The automatic gain control circuit 80 may use any adjustable gain element such as a current controlled resistor (ICR) or a voltage controlled resistor (VCR). Another difference in the embodiments is that the input stage 60 shown in FIG. 4 has a resistor 84 coupled between the L-C circuit 68 and the DC bias circuit 70. The resistor 84 improves the dynamic range of the input stage 60 and does not influence the DC bias of the amplifier 62.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A high gain input stage for a Radio Frequency Identification (RFID) transponder comprising:
   an amplifier for increasing a magnitude of an input signal;
   a DC bias circuit for controlling operation of said amplifier;
   a resonant circuit coupled between said amplifier and said DC bias circuit for receiving a signal generated by an electromagnetic field and for generating said input signal to said amplifier wherein an inductive portion of said resonant circuit is used to DC bias said amplifier;
   a current source;
   a first transistor having a first terminal coupled to said current source, a second terminal coupled to said resonant circuit, and a third terminal coupled to ground;
   an adjustable gain element having a first terminal coupled to said third terminal of said first transistor and a second terminal coupled to ground; and
   an automatic gain control circuit having an input coupled to said first terminal of said first transistor and an output coupled to said adjustable gain element.

2. A high gain input stage for a Radio Frequency Identification (RFID) transponder in accordance with claim 1 wherein said adjustable gain element is a current controlled resistor.

3. A high gain input stage for a Radio Frequency Identification (RFID) transponder in accordance with claim 1 wherein said adjustable gain element is a voltage controlled resistor.

4. A high gain input stage for a Radio Frequency Identification (RFID) transponder in accordance with claim 1 wherein said DC bias circuit comprises:
   a bias current source; and
   a second transistor having a first terminal coupled to said bias current source, a second terminal coupled to said resonant circuit and to said first terminal of said second transistor, and a third terminal coupled to ground.

5. A high gain input stage for a Radio Frequency Identification (RFID) transponder in accordance with claim 1 wherein said resonant circuit comprises;
   an inductive element; and
   a capacitive element coupled in parallel to said inductive element.

6. A high gain input stage for a Radio Frequency Identification (RFID) transponder in accordance with claim 1 further comprising a resistor coupled to said DC bias circuit and said resonant circuit for increasing a dynamic range of said high gain input stage without influencing DC bias of said amplifier.

7. A high gain input stage for a Radio Frequency Identification (RFID) transponder in accordance with claim 6 wherein said resonant circuit comprises:
   an inductive element; and
   a capacitive element coupled in parallel to said inductive element.

8. A high gain input stage for a Radio Frequency Identification (RFID) transponder comprising:
   an amplifier for increasing a magnitude of an input signal;
   a DC bias circuit for controlling operation of said amplifier;
   a resonant circuit coupled between said amplifier and said DC bias circuit for receiving a signal generated by an electromagnetic field and for generating said input signal to said amplifier wherein an inductive portion of said resonant circuit is used to DC bias said amplifier;
   wherein said amplifier comprises:
      a current source; and
      a first transistor having a first terminal coupled to said current source, a second terminal coupled to said resonant circuit, and a third terminal coupled to ground;
   wherein said DC bias circuit comprises:
      a bias current source; and
      a second transistor having a first terminal coupled to said bias current source, a second terminal coupled to said resonant circuit and to said first terminal of said second transistor, and a third terminal coupled to ground;
   an adjustable gain element having a first terminal coupled to said third terminal of said first transistor and a second terminal coupled to ground; and
   an automatic gain control circuit having an input coupled to said first terminal of said first transistor and an output coupled to said adjustable gain element.

9. A high gain input stage for a Radio Frequency Identification (RFID) transponder in accordance with claim 8 wherein said adjustable gain element is a current controlled resistor.

10. A high gain input stage for a Radio Frequency Identification (RFID) transponder in accordance with claim 8 wherein said adjustable gain element is a voltage controlled resistor.

11. A high gain input stage for a Radio Frequency Identification (RFID) transponder in accordance with claim 8 further comprising a resistor coupled to said DC bias circuit and said resonant circuit for increasing a dynamic range of said high gain input stage without influencing DC bias of said amplifier.

12. A method of providing a high gain input stage for a Radio Frequency Identification (RFID) transponder comprising the steps of:
   providing an amplifier for increasing a magnitude of an input signal;
   providing a DC bias circuit for controlling operation of said amplifier;
   providing a resonant circuit coupled between said amplifier and said DC bias circuit for receiving a signal generated by an electromagnetic field and for generating said input signal to said amplifier wherein an inductive portion of said resonant circuit is used to DC bias said amplifier;
   providing an adjustable gain element having a first terminal coupled to said third terminal of said first transistor and a second terminal coupled to ground; and
   providing an automatic gain control circuit having an input coupled to said first terminal of said first transistor and an output coupled to said adjustable gain element.

13. The method of claim 12 wherein said step of providing said amplifier further comprises the steps of:
   providing a current source; and
   providing a first transistor having a first terminal coupled to said current source, a second terminal coupled to said resonant circuit, and a third terminal coupled to ground.

14. The method of claim 12 wherein said step of providing said DC bias circuit comprises the steps of:
   providing a bias current source; and
   providing a second transistor having a first terminal coupled to said bias current source, a second terminal coupled to said resonant circuit and to said first terminal of said second transistor, and a third terminal coupled to ground.

15. The method of claim 12 wherein said step of providing said resonant circuit comprises the steps of:
   providing an inductive element; and
   providing a capacitive element coupled in parallel to said inductive element.

16. The method of claim 12 further comprising the step of providing a resistor coupled to said DC bias circuit and said a resonant circuit for increasing a dynamic range of said high gain input stage without influencing DC bias of said amplifier.

* * * * *